United States Patent
Kim et al.

(10) Patent No.: US 7,485,583 B2
(45) Date of Patent: Feb. 3, 2009

(54) METHOD FOR FABRICATING SUPERLATTICE SEMICONDUCTOR STRUCTURE USING CHEMICAL VAPOR DEPOSITION

(75) Inventors: Bum Joon Kim, Seoul (KR); Young Min Kim, Kyungki-do (KR); Young Chul Shin, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 460 days.

(21) Appl. No.: 11/328,227

(22) Filed: Jan. 10, 2006

(65) Prior Publication Data

US 2006/0194347 A1 Aug. 31, 2006

(30) Foreign Application Priority Data

Feb. 28, 2005 (KR) .................. 10-2005-0016787

(51) Int. Cl.
*H01L 21/205* (2006.01)
*C30B 25/02* (2006.01)

(52) U.S. Cl. .................. 438/761; 438/930; 117/98; 117/107; 427/255.34

(58) Field of Classification Search ............... 438/478, 438/761, 930; 117/93, 98, 102, 104, 105, 117/107; 427/255.32, 255.34
See application file for complete search history.

(56) References Cited

U.S. PATENT DOCUMENTS

| 4,681,773 | A | * | 7/1987 | Bean | 427/255.5 |
|---|---|---|---|---|---|
| 4,705,700 | A | * | 11/1987 | Ikeda et al. | 117/98 |
| 4,745,088 | A | * | 5/1988 | Inoue et al. | 117/98 |
| 4,928,626 | A | * | 5/1990 | Carlson et al. | 117/86 |
| 4,937,095 | A | * | 6/1990 | Fukatsu et al. | 427/580 |
| 4,969,416 | A | * | 11/1990 | Schumaker et al. | 118/725 |
| 5,298,107 | A | * | 3/1994 | Scudder et al. | 117/98 |
| 6,099,640 | A | * | 8/2000 | Negishi | 117/105 |
| 6,126,744 | A | * | 10/2000 | Hawkins et al. | 117/85 |
| 6,352,594 | B2 | * | 3/2002 | Cook et al. | 118/724 |
| 6,506,252 | B2 | * | 1/2003 | Boguslavskiy et al. | 117/200 |
| 6,685,774 | B2 | * | 2/2004 | Boguslavskiy et al. | 117/200 |
| 6,706,585 | B2 | | 3/2004 | Uchiyama et al. | |
| 6,887,736 | B2 | * | 5/2005 | Nause et al. | 438/104 |
| 6,902,620 | B1 | * | 6/2005 | Omstead et al. | 117/107 |
| 6,955,719 | B2 | * | 10/2005 | Dmitriev et al. | 117/91 |
| 7,176,054 | B2 | * | 2/2007 | Nause et al. | 438/104 |
| 7,381,052 | B2 | * | 6/2008 | Zhao et al. | 432/249 |
| 2004/0058463 | A1 | * | 3/2004 | NAuse et al. | 438/22 |
| 2005/0020035 | A1 | * | 1/2005 | Nause et al. | 438/478 |
| 2008/0017099 | A1 | * | 1/2008 | Onomura et al. | 117/89 |

\* cited by examiner

*Primary Examiner*—M. Wilczewski
(74) *Attorney, Agent, or Firm*—McDermott Will & Emery LLP

(57) ABSTRACT

The invention provides a method for fabricating a superlattice semiconductor structure capable of achieving excellent interfacial properties and uniformity. For the superlattice semiconductor structure according to the invention, a substrate is mounted on a susceptor within a process chamber. First and second source gases are supplied simultaneously to two different areas on the susceptor within the chamber to form first and second source gas areas separate from each other. The susceptor is rotated to revolve the substrate through the first and second source gas areas.

18 Claims, 10 Drawing Sheets

METHOD FOR FABRICATING SUPERLATTICE SEMICONDUCTOR STRUCTURE USING CHEMICAL VAPOR DEPOSITION

RELATED APPLICATION

This application claims the benefit of Korean Patent Application No. 2005-0016787 filed on Feb. 28, 2005, in the Korean Intellectual Property Office, the disclosure of which is incorporated herein by reference.

BACKGROUND OF THE INVENTION

1. Field of the Invention

The present invention relates to a method for fabricating a superlattice semiconductor structure using chemical vapor deposition. More particularly, the present invention relates to a method for fabricating a superlattice semiconductor structure capable of improving interfacial properties of a superlattice and attaining uniformity within and among substrates.

2. Description of the Related Art

With the recent drastic development in Light Emitting Diode (LED) or optoelectronic device using compound semiconductor such as AlGaInP, there is a rising demand for a superlattice semiconductor structure. For example, in fabricating group III-V semiconductor device, a buffer layer of the superlattice semiconductor structure can be formed between a substrate and a group III-V semiconductor layer, to solve problems caused by differences in lattice constant and thermal expansion coefficient between substrate material and group III-V compound semiconductor material. The superlattice semiconductor structure reportedly has advantages of inhibiting crystalline defects such as dislocation and improving electrical conductivity. Also, electron overflow can be prevented by forming an active layer of LED as a superlattice multiple quantum well structure. In addition, the superlattice semiconductor structure is greatly utilized in photonic crystal field. U.S. Pat. No. 6,706,585 discloses a method for fabricating layered superlattice materials via chemical vapor deposition. FIG. 1 is a schematic view of a compound semiconductor device with a general superlattice structure. Epitaxial layers 13, 14 of different compositions are stacked alternately and repeatedly on a substrate to form the superlattice structure. For example, the superlattice structure can be fabricated by stacking GaAs layer 13 and AlAs layer 14 alternately on the sapphire substrate 11.

However, to form the superlattice semiconductor structure requires regular and repeated growth of an ultrathin layer, which however renders it difficult to obtain uniformity and reproducibility of the superlattice structure in large-sized batch-type equipment. Further, interfacial properties of the superlattice structure are an influencing factor for properties of a total superlattice structure. But problems arising from fabrication process or fabrication equipment easily deteriorate interfacial properties of the superlattice structure.

FIG. 2 is a timing diagram for explaining a conventional method for fabricating a superlattice semiconductor structure. FIG. 3 is a schematic flow diagram of a metal-organic chemical vapor deposition (MOCVD) apparatus applied to a conventional fabrication method of FIG. 2. Conventionally, for example, to form the superlattice semiconductor structure of FIG. 1, an MOCVD process is utilized to supply different source gases alternately and repeatedly to a process chamber. Source gases are introduced into the reaction chamber to form and deposit the semiconductor layers.

Referring to the timing diagram of FIG. 2, "ON" indicates that corresponding source gas is being supplied to the process chamber (chamber mounted with a substrate), while "OFF" indicates that corresponding source gas is not being supplied to the chamber (supply stopped). A first source gas, for example, may be source gas for forming GaAs layer 13 (e.g. trimetil galum (TMG)), while a second source gas may be source gas for forming AlAs layer 14 (e.g. trimetil aluminium (TMA)) (refer to FIG. 1). As shown in FIG. 2, the first source gas (TMG) is supplied to the process chamber to form GaAs layer 13 on the substrate mounted within the process chamber. Thereafter, supply of the first source gas is halted, and the second source gas is supplied to the process chamber to form AlAs layer 14 on the GaAs layer 13. The superlattice semiconductor structure can be attained by repeating such one cycle process, as shown in FIG. 1.

Referring to a flow diagram of FIG. 3, a first source gas is continuously supplied by s first source gas supplier 41 through a gas controller 43 and then flows to a switching valve 49. At the same time, a second source gas is continuously supplied by a second source gas supplier 42 through a gas controller 44 and then flows to a switching valve 46. Each of the switching valves 49, 46 performs on/off operation. In the case of 'on' operation, corresponding source gas is supplied to a process chamber 70, whereas in the case of 'off' operation, corresponding source gas is exhausted into a vent. Each of the switching valves 49, 48 performs on/off operation alternately and thus only one of the first and second source gases is supplied through a nozzle 20 to a substrate 11 mounted on a susceptor or a susceptor 30. The susceptor 30 continues to be rotated during the process in order to revolve a plurality of substrates.

That is, as shown in FIGS. 2 and 3, while the first switching valve 49 is ON, the second switching valve 46 is OFF. Thus, only the first source gas (e.g. TMG) is supplied through a source gas introduction line 48 to the process chamber 70, while the second source gas (e.g. TMA) is exhausted into the vent 46a.

On the contrary, while the first switching valve 49 is OFF, the second switching valve 46 is ON. Consequently, only the second source gas is supplied to the process chamber 70, while the first source gas is exhausted into the vent 46a.

During supply of the first or second source gas, a third source gas (e.g, $AsH_3$, source gas of As) may be supplied through the source gas introduction line 47 and the nozzle 20 to the process chamber 70. Residual gas after reaction in the chamber 70 is exhausted outside through an exhaustion line 61. Repetition of such operation allows fabrication of the superlattice semiconductor structures 13, 14 as shown in FIG. 1.

However, according the aforesaid method for fabricating the superlattice semiconductor structure, the switching valve is selectively switched, causing half of source gas to be exhausted into the vents 49a, 46a and thus unnecessarily increasing purchase price of source gas. Further, the switching valves are placed at a considerable distance from the process chamber so that it takes great time for a desired semiconductor layer to grow after switching of source gas. In addition, it takes substantial time before source gas is evenly spread to ensure uniform growth of the semiconductor layer in a batch-type process chamber. Such time requirement deteriorates interfacial properties of the superlattice, impairs uniformity within and among the substrates and leads to low reproducibility. Also, the aforesaid time requirement and difficult control of on/off operation prolongs process time and complicates process.

SUMMARY OF THE INVENTION

The present invention has been made to solve the foregoing problems of the prior art and it is therefore an object of the present invention to provide a method for fabricating a superlattice semiconductor structure using chemical vapor deposition (CVD) capable of preventing waste of source gas, improving interfacial properties of a superlattice and attaining superior reproducibility and uniformity.

It is another object of the invention to provide a method for fabricating a superlattice semiconductor structure using CVD capable of simplifying process and shortening process time.

According to an aspect of the invention for realizing the object, there is provided a method for fabricating a superlattice semiconductor structure comprising steps of: mounting a substrate on a susceptor within a process chamber; supplying first and second source gases simultaneously to two different areas on the susceptor within the process chamber to form first and second source gas areas separate from each other; and rotating the susceptor to revolve the substrate through the first and second source gas areas. A plurality of substrates may be mounted on the susceptor.

According to the invention, the first and second source gases comprise an organometallic source gas. But the invention is not limited to metal-organic chemical vapor deposition (MCVD), and may adopt other types of CVD processes in order to fabricate the superlattice semiconductor structure.

According to the invention, the first and second source gas areas are provided to form different semiconductor layers. To form source gas areas separate from each other, the first and second source gases are injected separately into the process chamber and exhausted separately out of the process chamber.

According to the invention, in the susceptor rotating step, when the substrate passes through the first source gas area, a first semiconductor layer is formed, and when the substrate passes through the second source gas area, a second semiconductor layer is formed.

According to one embodiment of the invention, the first semiconductor layer has a first composition of $Al_aGa_bIn_{1-a-b}P$, where $0 \leq a \leq 1$, $0 \leq b \leq 1$, and $0 \leq a+b \leq 1$, and the second semiconductor layer has a second composition of $Al_cGa_dIn_{1-c-d}P$ different from the first composition, where $0 \leq c \leq 1$, $0 \leq d \leq 1$, and $0 \leq c+d \leq 1$.

According to another embodiment, the first semiconductor layer has a first composition of $Al_xGa_{1-x}As$, where $0 \leq x \leq 1$, and the second semiconductor layer has a second composition of $Al_yGa_{1-y}As$ different from the fist composition, where $0 \leq y \leq 1$.

According to further another embodiment, the first semiconductor layer has a first composition of $Al_mGa_{1-m}N$, where $0 \leq m \leq 1$, and the second semiconductor layer has a second composition of $Al_nGa_{1-n}N$ different from the fist composition, where $0 \leq n \leq 1$.

According to one embodiment of the invention, after the substrate starts to revolve on the susceptor, the first and second source gases are supplied to the process chamber.

According to another embodiment, before the substrate starts to revolve on the susceptor, the first and second source gases are supplied to the process chamber.

According to the preferred embodiment of the invention, during one revolution of the substrate, semiconductor layers corresponding to one cycle of the superlattice semiconductor structure are formed. Also, according to the preferred embodiment of the invention, the process chamber is a horizontal process chamber, and the first and second source gases are injected thereinto horizontally.

According to one embodiment of the invention, the first and second source gases supplying step further comprises supplying a third source gas to a total area on the susceptor within the process chamber while supplying the first and second source gases simultaneously to the process chamber. In this case, the first and second source gases are injected horizontally into the process chamber, and the third source gas is injected vertically into the process chamber. The third source gas may comprise one selected from a group consisting of $AsH_3$, $PH_3$, and $NH_3$. The third source gas may further comprise $H_2$, $N_2$ or a mixture thereof.

According to one embodiment of the invention, the substrate is revolved at a constant speed. Preferably, the substrate is revolved at a speed of 1 to 10 rpm. Also, the thickness of one cycle of the superlattice semiconductor structure is controlled by adjusting revolution speed of the substrate. In the substrate mounting step, a plurality of substrates can be mounted on the susceptor.

Unlike a conventional method for obtaining the superlattice structure by alternately switching conventional switching valves, the substrate is revolved within the process chamber to form two different source gas areas separate from each other within the process chamber. Accordingly, the substrate passes through the two source gas areas to form different semiconductor layers alternately and periodically.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
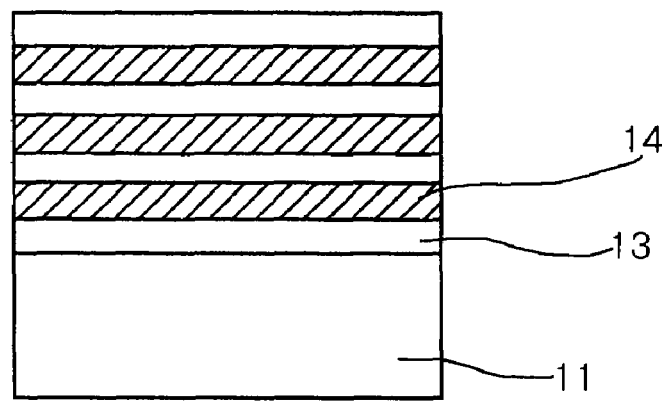
FIG. 1 is a sectional view of a compound semiconductor device having a general superlattice structure.

The present invention will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity and the same reference numerals are used throughout the different drawings to designate the same or similar components.

Figure 12:
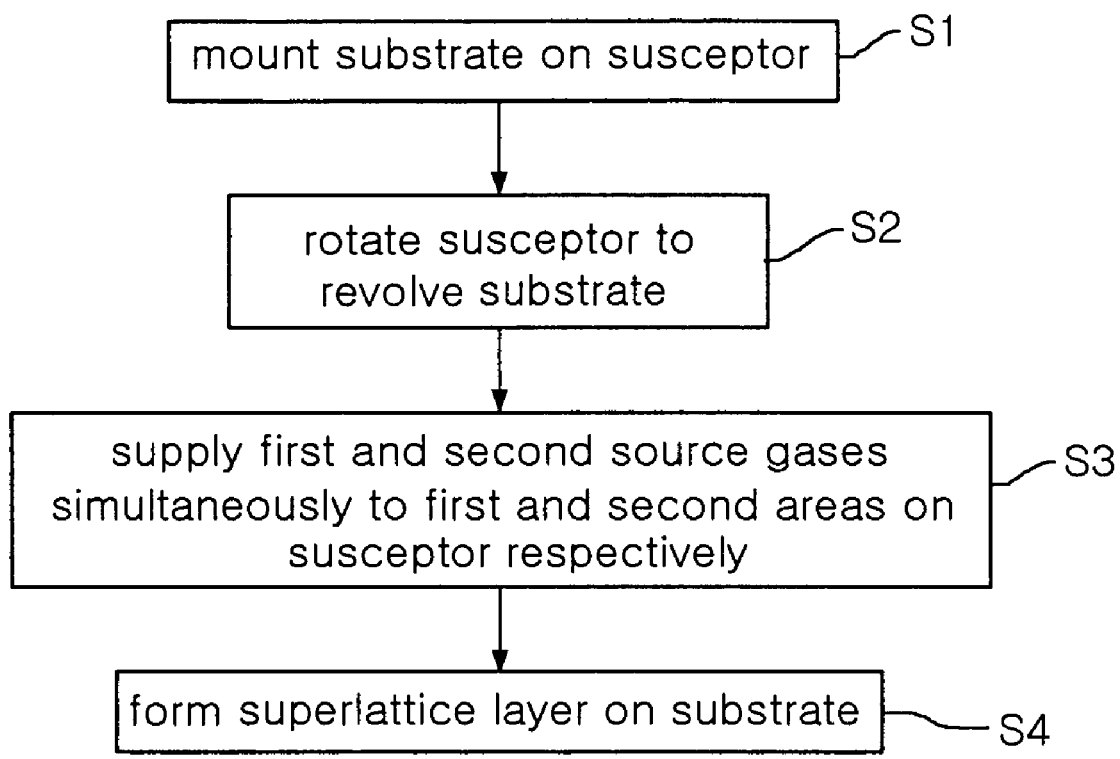
FIG. 12 is a flow chart for explaining a fabrication method of superlattice semiconductor structure according to one embodiment of the invention.

First, a method for fabricating a superlattice semiconductor structure according to one embodiment of the invention will be explained in reference to FIGS. 4, 5a and 12.

Figure 2:
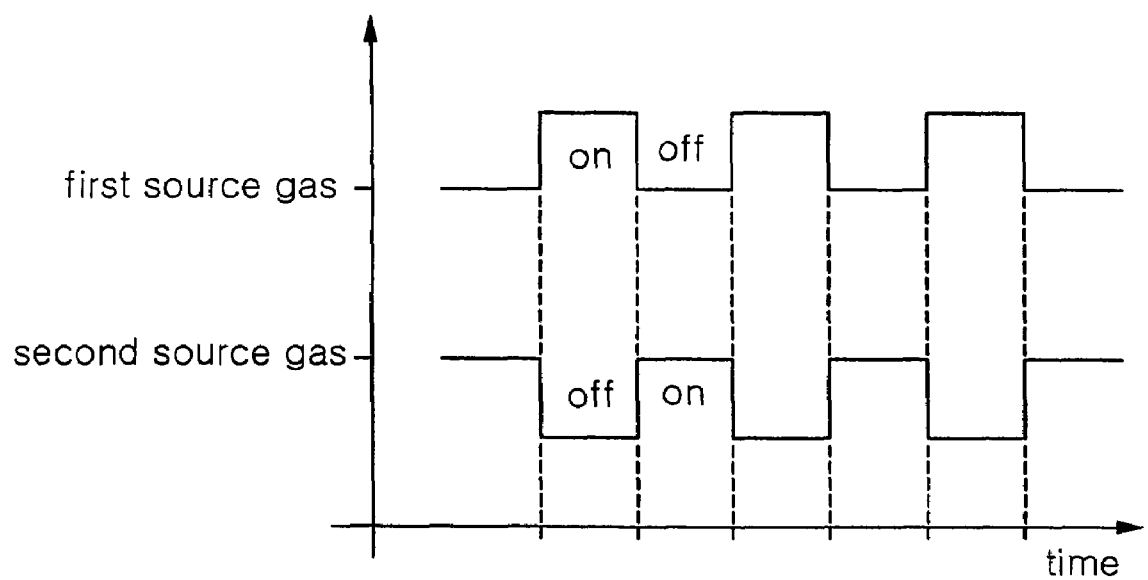
FIG. 2 is a timing diagram for explaining a conventional fabrication method of a superlattice semiconductor structure.
Figure 3:
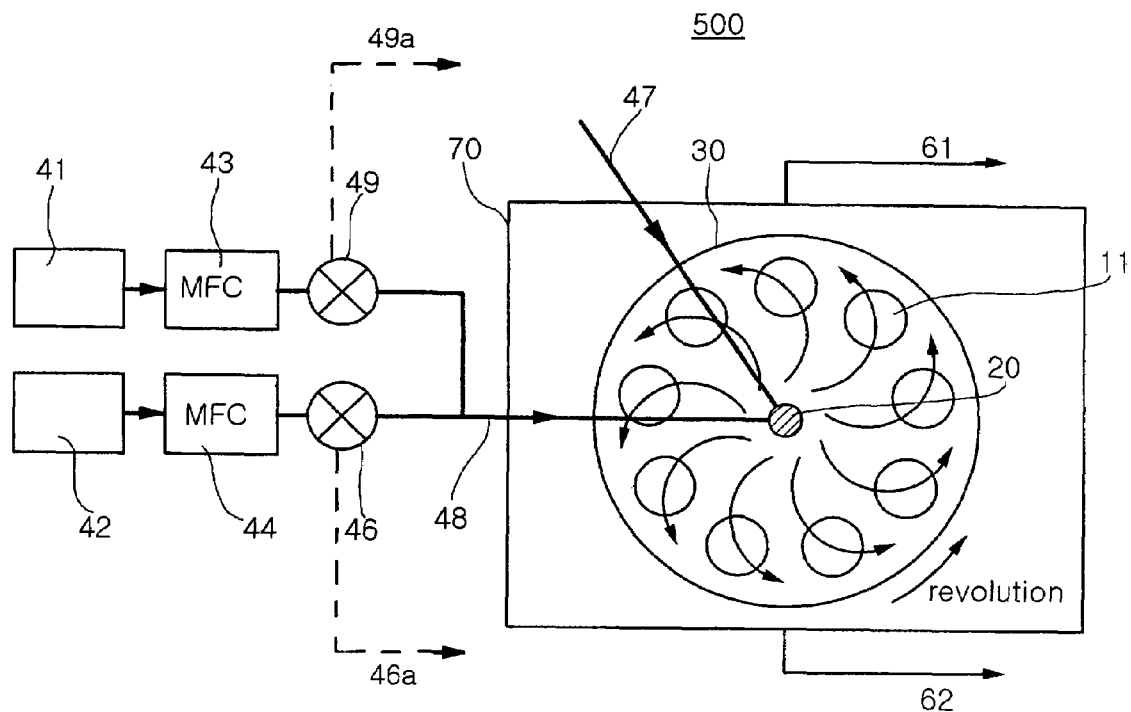
FIG. 3 is a schematic flow diagram of a metal-organic chemical vapor deposition (MOCVD) apparatus to fabricate the superlattice semiconductor structure according to a conventional method.
Figure 4:
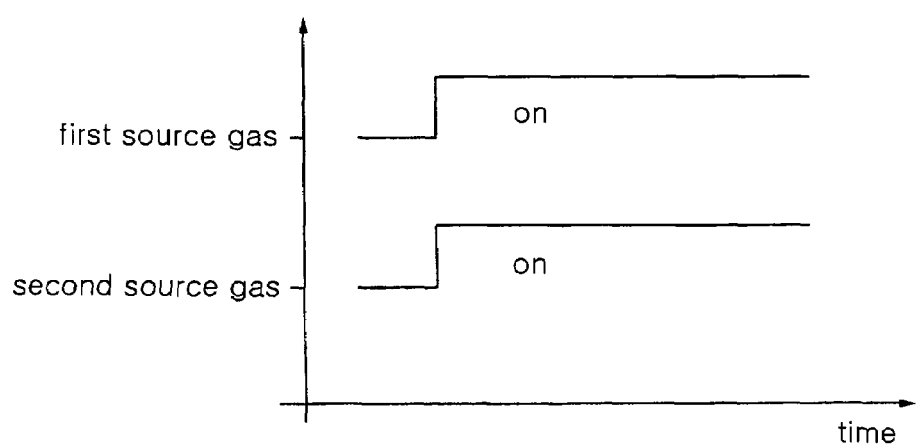
FIG. 4 is a timing diagram for explaining a fabrication method of a superlattice semiconductor structure according to one embodiment of the invention.

FIG. 4, which is contrasted with FIG. 2, is a timing diagram for explaining a fabrication method of the superlattice semiconductor structure according to one embodiment of the invention. FIG. 5a, which is contrasted with FIG. 3 is a schematic flow diagram of a metal-organic chemical vapor deposition (MOCVD) apparatus to fabricate the superlattice semiconductor structure according to one embodiment of the invention. Also, FIG. 12 is a flow chart for explaining a fabrication method of the superlattice semiconductor structure according to one embodiment of the invention.

To form the superlattice semiconductor structure, first, substrates 101 are mounted on a susceptor 130 within a horizontal process chamber 170 (S1). The susceptor or susceptor 130 is constructed rotatable, and has a sufficient-sized area capable of seating a plurality of substrates 101. The substrate 101 is mounted apart from the center of the susceptor 130 so that the substrates 101 can be revolved with rotation of the susceptor 130.

Thereafter, the susceptor 130 having the substrates 101 mounted thereon is rotated to revolve the substrates 101 (S2). At this time to prevent the revolved substrates 101 from skidding out of the susceptor 130, suitable chucks may be used. The substrates 101 may be revolved at a constant speed during the deposition process. Alternatively, revolution speed (rotation speed of the susceptor) may be varied during the process.

Figure 5A:
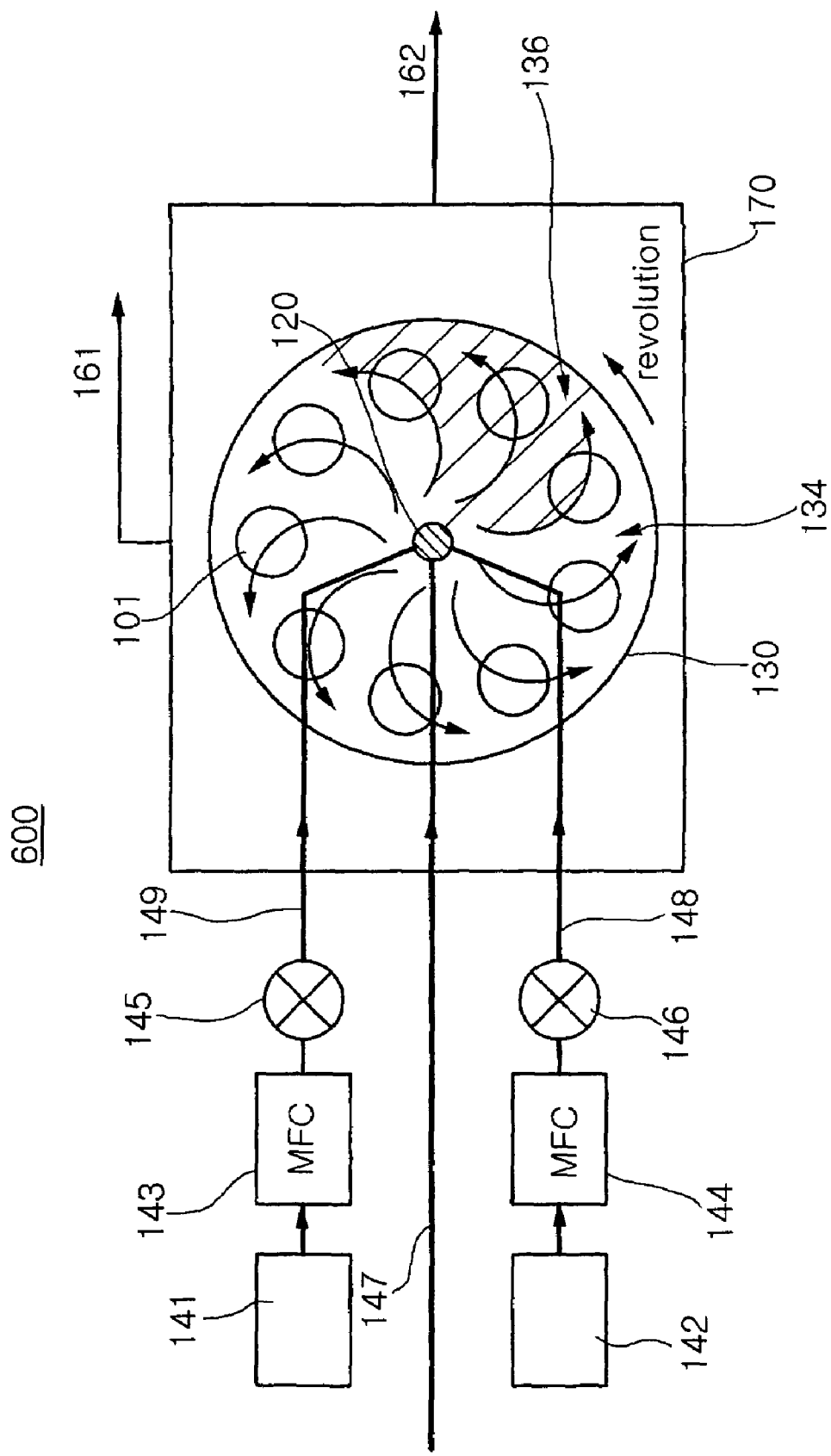
FIG. 5a is a schematic flow diagram of an MOCVD apparatus to fabricate the superlattice semiconductor structure according to one embodiment of the invention.

Then, as shown in FIG. 5a, during revolution of each substrate 101, a first source gas (for example, TMG gas) is supplied from a first source gas supplier 141 through a flow controller 143, a valve 145 and a first source gas introduction line 149 to a process chamber 170. At the same time, a second source gas (for example, TMA gas) is supplied from a second source gas supplier 142 through a flow controller 144, a valve 146 and a second source gas introduction line 148 to the process chamber 170 (S3). The first and second source gases are injected into the process chamber 170 through a nozzle 120. The first and second source gases are supplied inside the process chamber 170 simultaneously so that the valves 145, 146 do not require separate vents. Therefore, unlike a conventional method, source gases are not wasted. When the first and second source gases are supplied to the process chamber 170, a third source gas may be supplied to the process chamber 170 through another introduction line 147. Alternatively, before the substrate 101 starts to revolve on the susceptor 130, the first and second source gases may be supplied to the process chamber 170.

As shown in FIG. 4, the first and second source gases are supplied to the process chamber 170 simultaneously, not requiring separate on/off operations during the supply. Instead, in order to grow different semiconductor layers alternately, as stated above, a first area 134 and a second area 130, separate from each other, are formed, while the substrates 101 are revolved within the process chamber 170. The first area 134 corresponds to the first source gas area whereas the second area 130 corresponds to the second source gas area.

To form the source gas areas separate from each other 134, 130, the first and second source gases should be injected separately into different areas of the process chamber 170 and each source gas injected should not be mixed together.

To inject the first and second source gases separately into different areas; the nozzle 120 for injecting the first and second source gases should have first and second source gas passages separate from each other, and injection parts of each source gas should be placed apart from each other. U.S. Pat. No. 687,973 discloses a nozzle in which different gases are injected separately into a process chamber.

Also, to prevent mixing of different source gases separately injected into different areas, residual gases should be exhausted separately after reaction of each source gas. To this end, a first source gas exhaustion line is installed adjacent to the first source gas area while a second source gas exhaustion line is installed adjacent to the second source gas area.

Figure 5B:
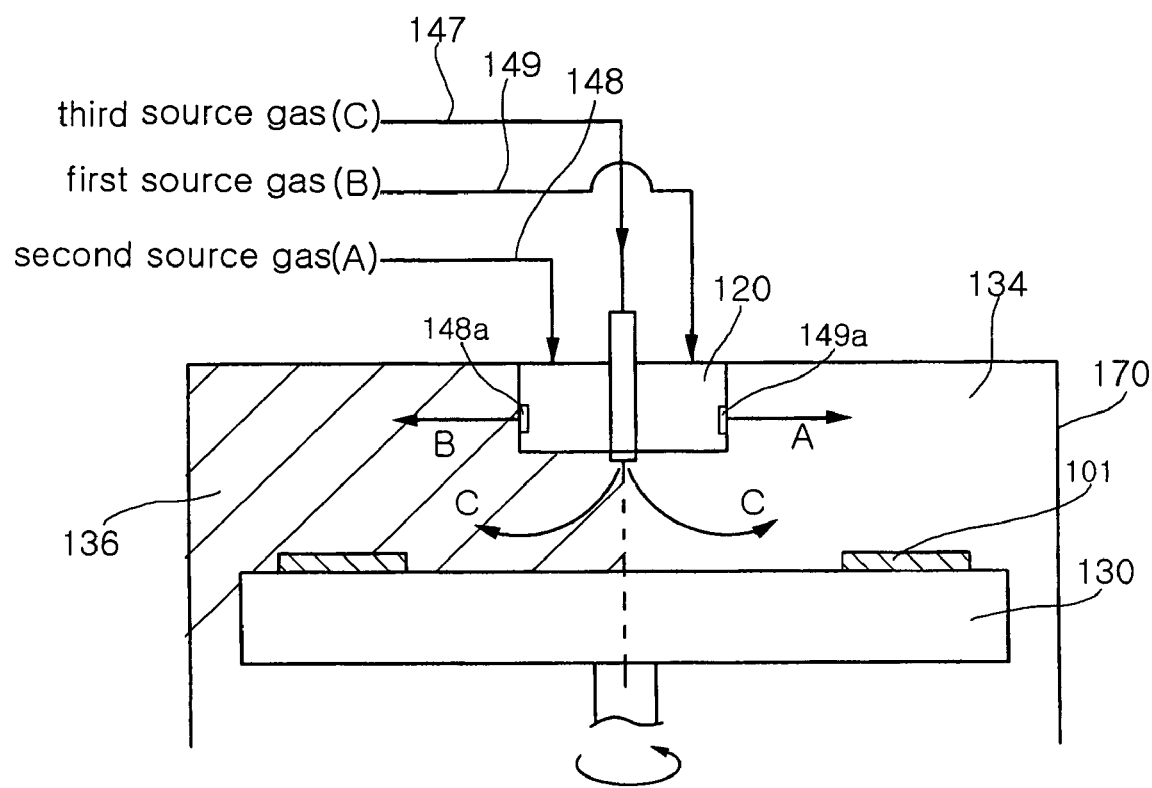
FIG. 5b is a schematic view illustrating a sectional structure of a process chamber of the MOCVD apparatus.

Referring to FIG. 5b, a first source gas B and a second source gas A are separated from each other by the nozzle 120 and injected horizontally into different areas through different injection parts 148a, 149a. Furthermore, a third gas C is injected vertically across the total area. The third source gas C, for example, is necessary for both the first source gas area 134 and the second source gas area 136 like $AsH_3$ used to form a superlattice. Therefore, as described above, the third source gas is supplied to the entire first and second areas 134, 136. In order to control the pressure of the third source gas, the third gas may further comprise $H_2$, $N_2$ or a mixture thereof.

Further, since a first source gas exhaustion line 161 and a second source gas exhaustion line 162 are installed separately (refer to FIG. 5a), the first source gas exhaustion line 161 is installed adjacent to the first source gas area 134 whereas the second source gas exhaustion line 162 is installed adjacent to the second source gas area 136. Therefore, the MOCVD apparatus employed in the embodiment is suitably implemented to ensure formation of the source gas areas 134, 136 separate from each other.

Figure 7:
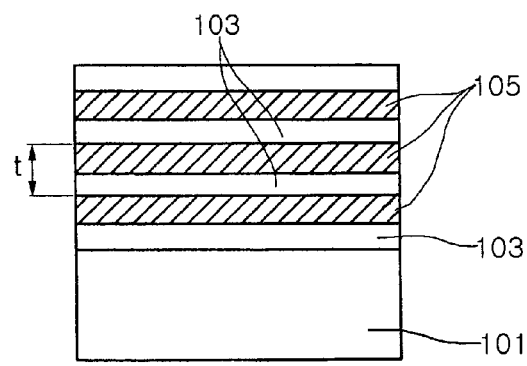
FIG. 7 is a sectional view of the superlattice semiconductor structure according to one embodiment of the invention.

The source gas areas are formed separate from each other on the susceptor 130 within the chamber 170 during revolution of the substrate 101 so that the substrate 101 passes through the two different source gas areas 134, 136 during each revolution. As a result, on the substrate 101, different semiconductor layers are formed alternately and periodically (S4). More specifically, when the susceptor 130 is rotated to revolve the substrate 101 through the first source gas area 134, the first semiconductor layer (refer to numeral 103 in FIG. 7) is formed on the substrate 101. Also, when the susceptor 130 is rotated to revolve the substrate 101 through the second area 136, the second semiconductor layer (refer to numeral 105 in FIG. 7) is formed on the substrate 101. With repeated revolution of the substrate 101, the first and second semiconductor layers are grown alternatively on the substrate 101 to form a superlattice structure (refer to FIG. 7).

Figure 6:
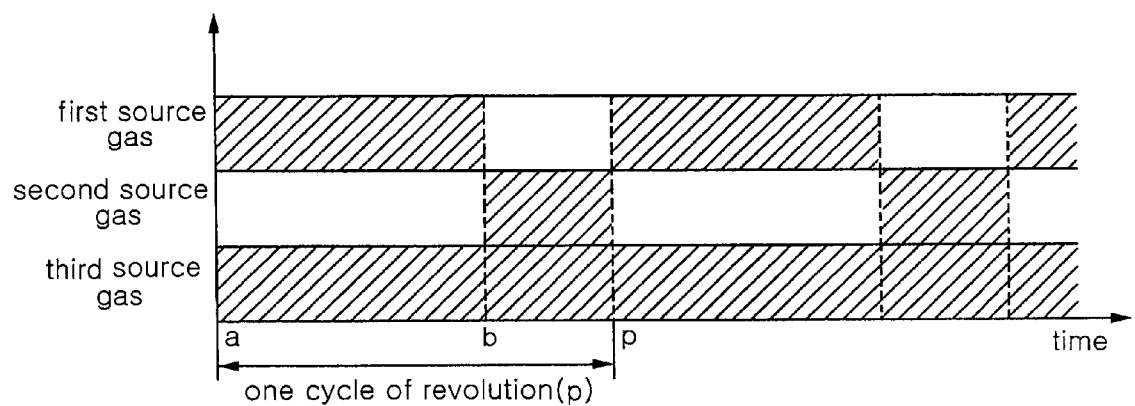
FIG. 6 is a graph illustrating the fabrication method of the superlattice semiconductor structure according to one embodiment of the invention.

A graph of FIG. 6 schematically illustrates types of gases supplied during revolution of the substrate 101. Hatched parts in FIG. 6 mean that the substrate 101 is supplied with corresponding gas. The revolving substrate 101 is supplied with the first source gas while passing through the first source gas area 134 during the period ranging from a to b. At this time, the first semiconductor layer is formed on the substrate 101. Also when the substrate 101 passes through the second source area 134 to be supplied with the second source gas, the second semiconductor layer is formed on the substrate 101. The substrate 101 is supplied with a third source gas during the entire process. Repetition of this process allows formation of the superlattice structure on the substrate 101. Herein the period ranging from a to p corresponds to a revolution cycle of the substrate 101.

According to the embodiment, the substrate 101 is supplied alternately with different source gases during the revolution thereof, thus not requiring time for switching source gas unlike the conventional method. Further, each source gas area 134, 136 is uniformly formed so that it does not take time to obtain uniform growth unlike the conventional method. Therefore, the superlattice semiconductor structure fabricated according to the embodiment has superior interfacial properties, showing improvement in uniformity within and among the substrates. Especially stable lamina flow is easily obtained within the horizontal process chamber 170 so that uniformity within and among the substrates can be enhanced.

Preferably, when the susceptor 170 is rotated to revolve the substrate 101 once, semiconductor layers corresponding to one cycle of the superlattice semiconductor structure (semiconductor layers corresponding to thickness t in FIG. 7) are formed on the substrate 101. In this case, by controlling revolution times of the substrate 101, the number of superlattice semiconductor structure layers can be precisely controlled. In addition, according to the invention, when other conditions such as the source gas flow supplied are equal, the thickness t of one cycle of the superlattice semiconductor structure can be controlled precisely by adjusting revolution speed of the substrate 101. Proper adjustment of revolution speed allows one cycle of superlattice having even thickness of 1 nm or less.

A fabrication method of the superlattice according to the invention may be applied to fabricate a superlattice structure of various compound semiconductors. For example, to form the superlattice structure in which AlGaInP layer with different compositions are alternately stacked, the fabrication method of the invention can be easily employed (use $PH_3$ as a third source gas). In addition, the present invention may be applied to form GaAs/AlAs superlattice structure (use $AsH_3$ as a third source gas) or GaN/AlGaN-based superlattice structure (use $NH_3$ as a third source gas).

Figure 8:
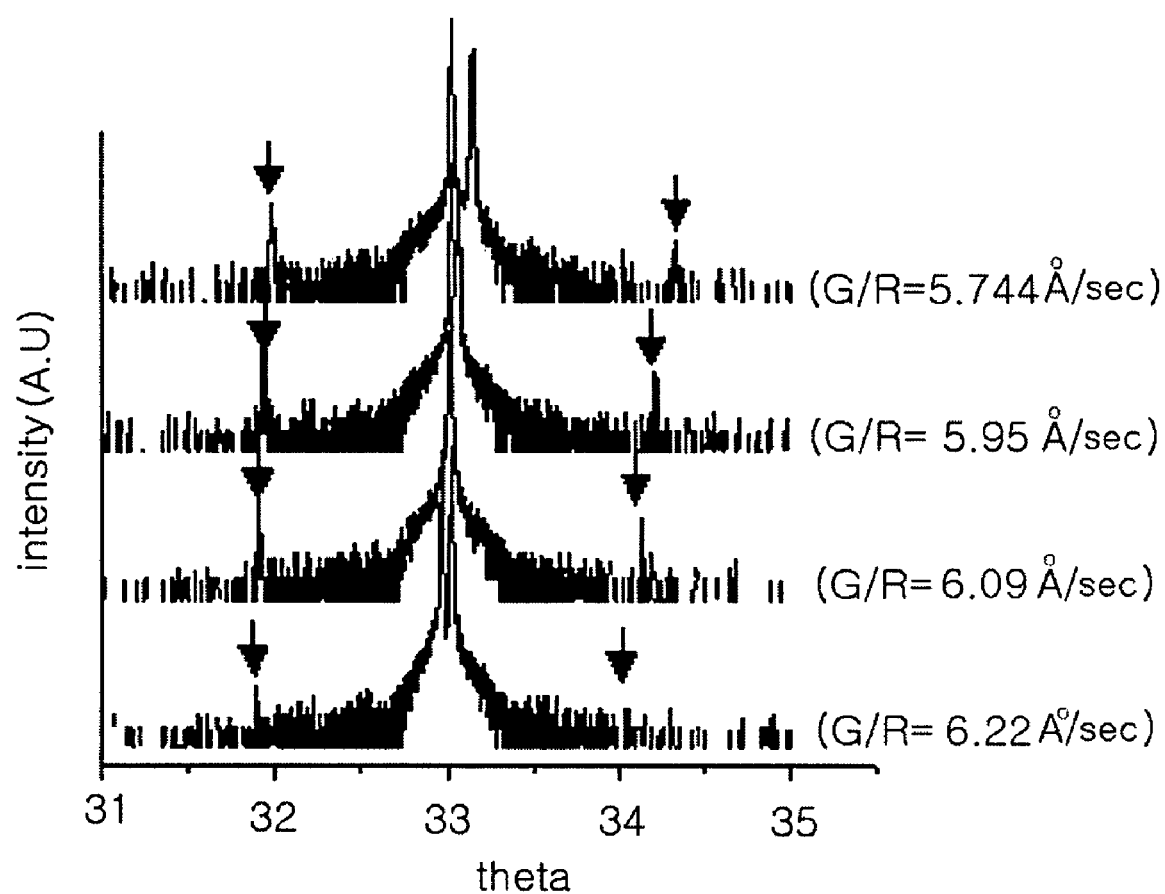
FIG. 8 is a view illustrating results of X-ray diffraction (XRD) test for AlGaInP single layer included in AlGaInP superlattice semiconductor structure fabricated according to the invention, showing XRD rocking curves of AlGaInP single layer formed with different growth speed.

The inventors fabricated superlattice structures by alternately growing the first AlGaInP layer and the second AlInP layer having different compositions while varying rotation speed of the susceptor (revolution speed of the substrate). Graphs of FIGS. 8 and 9 and TEM picture of FIG. 10 were obtained through test and analysis of the fabricated AlGaInP samples. FIG. 8 shows rocking curves for AlInP superlattice structure samples grown with different speed. The thickness of one cycle of the superlattice structure is inversely proportional to theta interval between the greatest peak (0th order peak) and the second greatest peak (arrow). As a result, as shown in FIG. 8, increase in growth rate leads to increase in thickness of one cycle of the superlattice structure.

Figure 9:
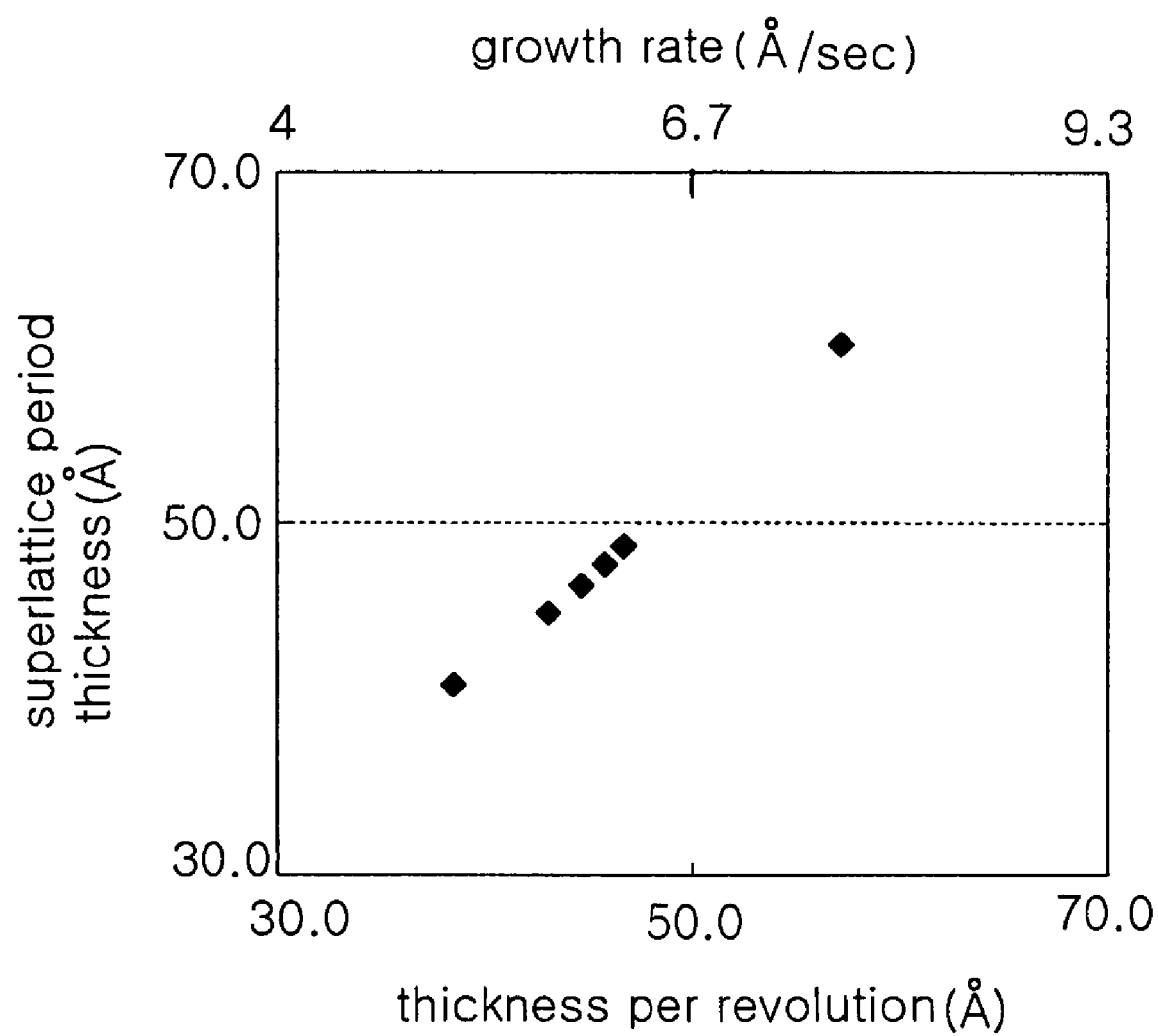
FIG. 9 is a graph illustrating thickness change of one cycle of AlGaInP superlattice in accordance with growth speed of AlGaInP layer.
Figure 10:
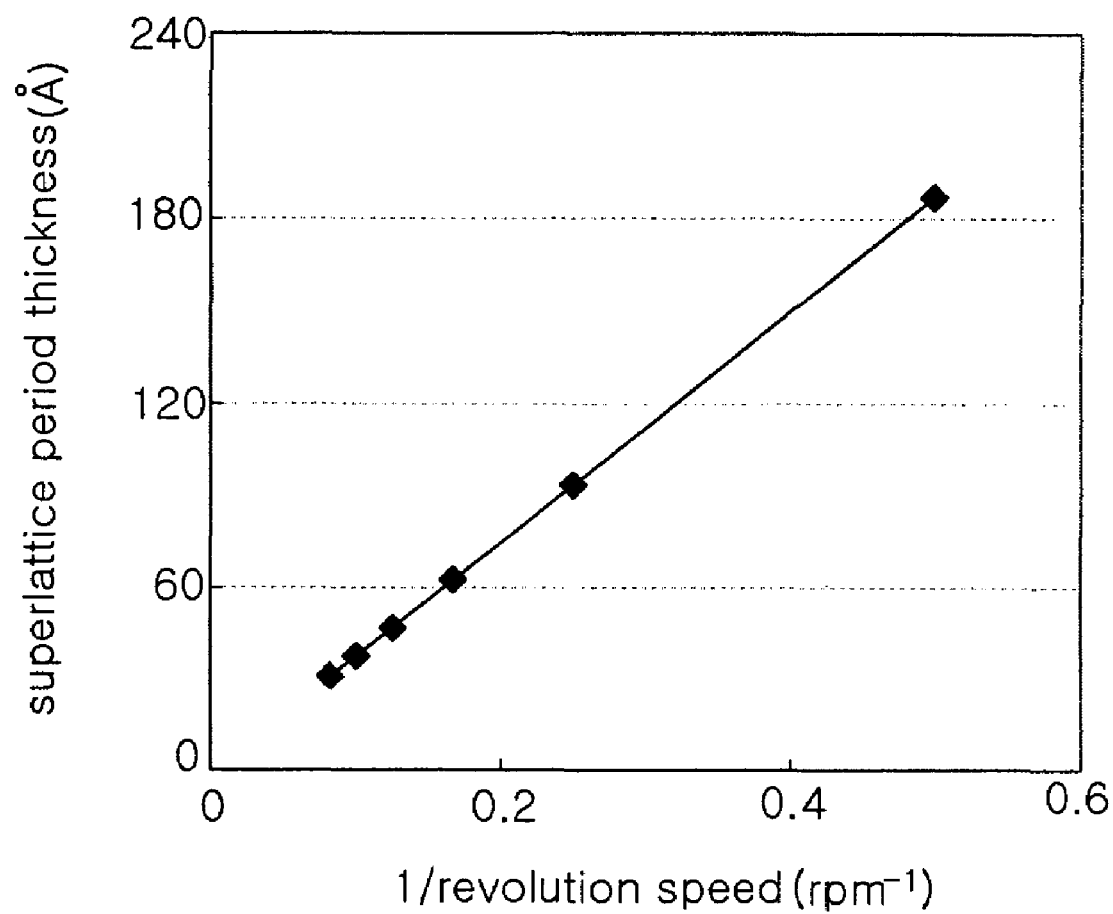
FIG. 10 is a graph illustrating thickness change of one cycle of AlGaInP superlattice in accordance with inverse number of revolution speed of a substrate.
Figure 11:
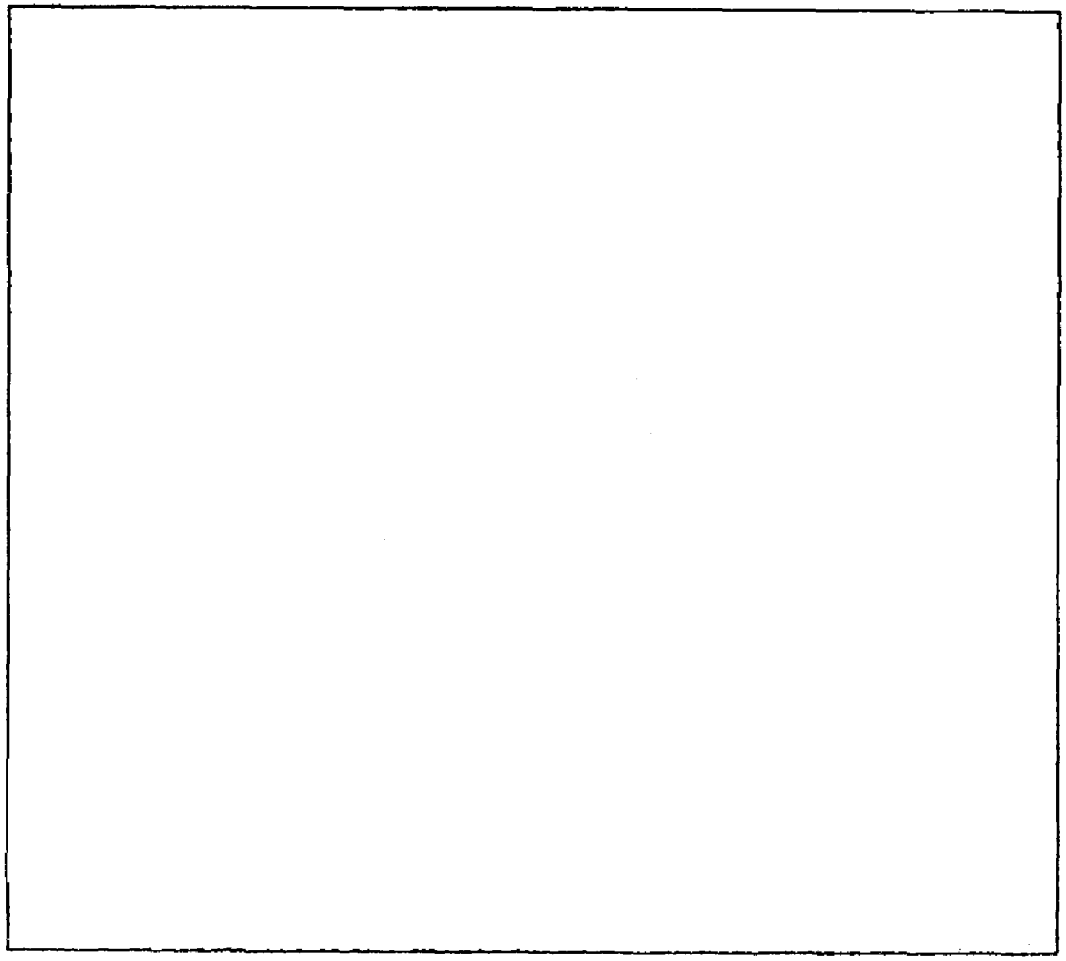
FIG. 11 is a TEM picture illustrating section of AlGaInP superlattice semiconductor structure fabricated according to the invention.

FIG. 9 shows a relationship between growth rate and thickness of one cycle of the superlattice (that is, superlattice period thickness). As shown in FIG. 9, the superlattice period thickness changes linearly in accordance with growth rate. FIG. 10 indicates a relationship between inverse number of revolution speed and superlattice period thickness. Referring to FIG. 10, the superlattice period thickness changes linearly in accordance with inverse number value of revolution speed. Therefore, when other process conditions (flow, temperature, pressure) are maintained constant, only revolution speed of the substrate can be adjusted to precisely control growth rate of the superlattice and thickness of one cycle thereof. In addition, as shown in TEM picture of FIG. 11, a high-quality superlattic structure having good interfacial properties and uniform thickness can be obtained.

As set forth above, according to the invention, the revolved substrate passes through different source gas areas to fabricate the superlattice semiconductor structure having good interfacial properties and uniformity. Especially, with formation of semiconductor layers through stable lamina flow, uniformity within and among the substrates is significantly boosted. Also, waste of source gas is prevented, leading to reduction in fabrication costs of the superlattice. In addition, useful life of the valves can be lengthened due to no need for on/off operation that is repeated for a long period. Further, the thickness of one cycle of the superlattice structure can be controlled precisely and easily by adjusting revolution speed of the substrate, and the superlattice structure having thickness of 1 nm or less can be fabricated.

While the present invention has been shown and described in connection with the preferred embodiments, it will be apparent to those skilled in the art that modifications and variations can be made without departing from the spirit and scope of the invention as defined by the appended claims.

What is claimed is:

1. A method for fabricating a superlattice semiconductor structure comprising steps of:
   mounting a substrate on a susceptor within a process chamber;
   supplying first and second source gases simultaneously to two different areas on the susceptor within the process chamber to form first and second source gas areas separate from each other; and
   rotating the susceptor to revolve the substrate through the first and second source gas areas,
   wherein in the susceptor rotating step, a first semiconductor layer is formed when the substrate passes through the first source gas area, and a second semiconductor layer that is different from the first semiconductor layer is formed when the substrate passes through the second source gas area.

2. The method according to claim 1, wherein the first and second source gases comprise an organometallic source gas.

3. The method according to claim 1, wherein in the first and second source gases supplying step, the first and second source gases are injected separately into the process chamber and exhausted separately out of the process chamber.

4. The method according to claim 1, wherein the first semiconductor layer has a first composition of $Al_aGa_bIn_{1-a-b}P$, where $0 \leq a \leq 1$, $0 \leq b \leq 1$, and $0 \leq a+b \leq 1$, and the second semiconductor layer has a second composition of $Al_cGa_dIn_{1-c-d}P$ different from the first composition, where $0 \leq c \leq 1$, $0 \leq d \leq 1$, and $0 \leq c+d \leq 1$.

5. The method according to claim 1, wherein the first semiconductor layer has a first composition of $Al_xGa_{1-x}As$, where $0 \leq x \leq 1$, and the second semiconductor layer has a second composition of $Al_yGa_{1-y}As$ different from the first composition, where $0 \leq y \leq 1$.

6. The method according to claim 1, wherein the first semiconductor layer has a first composition of $Al_mGa_{1-m}N$, where $0 \leq m \leq 1$, and the second semiconductor layer has a second composition of $Al_nGa_{1-n}N$ different from the fist composition, where $0 \leq n \leq 1$.

7. The method according to claim 1, wherein after the substrate starts to revolve on the susceptor, the first and second source gases are supplied to the process chamber.

8. The method according to claim 1, wherein before the substrate starts to revolve on the susceptor, the first and second source gases are supplied to the process chamber.

9. The method according to claim 1, wherein during one revolution of the substrate, semiconductor layers corresponding to one cycle of the superlattice semiconductor structure are formed.

10. The method according to claim 1, wherein the process chamber is a horizontal process chamber, and the first and second source gases are injected thereinto horizontally.

11. The method according to claim 1, further comprising: supplying a third source gas to a total area on the susceptor within the process chamber while supplying the first and second source gases simultaneously to the process chamber.

12. The method according to claim 11, wherein the first and second source gases are injected horizontally into the process chamber, and the third source gas is injected vertically into the process chamber.

13. The method according to claim 11, wherein the third source gas comprises one selected from a group consisting of $AsH_3$, $PH_3$, and $NH_3$.

14. The method according to claim 13, wherein the third source gas further comprises one selected from a group consisting of $H_2$, $N_2$ and a mixture thereof.

15. The method according to claim 1, wherein in the susceptor rotating step, the substrate is revolved at a constant speed.

16. The method according to claim 1, wherein the substrate is revolved at a speed of 1 to 10 rpm.

17. The method according to claim 1, wherein the thickness of one cycle of the superlattice semiconductor structure is controlled by adjusting revolution speed of the substrate.

18. The method according to claim 1, wherein in the substrate mounting step, a plurality of substrates are mounted on the susceptor.

\* \* \* \* \*